(12) United States Patent
Okada et al.

(10) Patent No.: US 8,546,683 B2
(45) Date of Patent: Oct. 1, 2013

(54) ELECTRICALLY CONDUCTIVE GLASS AND PHOTOELECTRIC CONVERSION ELEMENT USING THE SAME

(75) Inventors: Kenichi Okada, Tokyo (JP); Hiroshi Matsui, Tokyo (JP); Nobuo Tanabe, Tokyo (JP)

(73) Assignee: Fujikura Ltd., Tokyo (JP)

( * ) Notice: Subject to any disclaimer, the term of this patent is extended or adjusted under 35 U.S.C. 154(b) by 1538 days.

(21) Appl. No.: 10/947,225

(22) Filed: Sep. 23, 2004

(65) Prior Publication Data

US 2005/0034755 A1 Feb. 17, 2005

(30) Foreign Application Priority Data

Mar. 26, 2002 (JP) .................................. 2002-086859
Nov. 18, 2002 (JP) .................................. 2002-333598

(51) Int. Cl.
*H01L 31/00* (2006.01)
*B32B 9/00* (2006.01)
*B32B 15/04* (2006.01)

(52) U.S. Cl.
USPC ......... 136/256; 136/263; 428/469; 428/472.2

(58) Field of Classification Search
USPC .................. 136/263, 256; 428/469–472.3
See application file for complete search history.

(56) References Cited

U.S. PATENT DOCUMENTS 6,008,451 A * 12/1999 Ichinose et al. ............... 136/256
6,291,763 B1 * 9/2001 Nakamura .................... 136/256
6,683,244 B2 * 1/2004 Fujimori et al. .............. 136/263

FOREIGN PATENT DOCUMENTS

| EP | 1119068 A1 | 6/2000 |
| EP | 1178542 A1 | 2/2002 |
| JP | S60-12604 A | 1/1985 |
| JP | S60-262304 A | 12/1985 |
| JP | 61-116883 | * 6/1986 |
| JP | S61-116883 A | 6/1986 |
| JP | S62-127586 U | 8/1987 |
| JP | H01-140676 A | 6/1989 |
| JP | H03-88223 U | 9/1991 |
| JP | 2003-203681 A | 7/2003 |

OTHER PUBLICATIONS

Gulbransen, E.A. et al, "The Kinetics of Oxidation of High Purity Nickel". J. Electrochem. Soc. 101, 128-140. (1954).*
"HG Houston Website", http://hghouston.com/ss_comp.html from Aug. 23, 1999, 2 pages. Available from www.archive.org.*

* cited by examiner

*Primary Examiner* — Jonathan Johnson
*Assistant Examiner* — Allison Bourke
(74) *Attorney, Agent, or Firm* — Sughrue Mion, PLLC

(57) ABSTRACT

The electrically conductive glass is obtained by providing a transparent electrically conductive film 12 such as ITO or FTO on a glass plate, and providing a grid including a film of a passivated metal on this transparent electrically conductive film. An insulating, fine oxide film formed on the surface of the passivated metal prevents leakage current from flowing from the grid to an electrolyte. In addition, leakage current is prevented from flowing from the transparent electrically conductive film to the electrolyte by providing a diffusion-preventing film including titanium or titanium oxide between the transparent electrically conductive film and the grid.

4 Claims, 6 Drawing Sheets

ELECTRICALLY CONDUCTIVE GLASS AND PHOTOELECTRIC CONVERSION ELEMENT USING THE SAME

TECHNICAL FIELD

The present invention relates to a electrically conductive glass used in a dye-sensitized solar cell or other photoelectric conversion element, having high electrical conductivity and transparency, which is able to reduce leakage current when used in a photoelectric conversion element.

The present application is a continuation of International Application No. PCT/JP03/03626 filed Mar. 25, 2003, and claims the benefit of Japanese Application No. 2002-86859 filed on Mar. 26, 2002 and Japanese Application No. 2002-333589 filed on Nov. 18, 2002, which applications are incorporated herein by reference in their entireties.

BACKGROUND ART

An invention of a prior application was previously filed by the inventor of the present invention relating to this type of electrically conductive glass in the form of Japanese Patent Application No. 2001-400593 (filing date: Dec. 28, 2001).

FIGS. 1-3 show an electrically conductive glass.

In FIG. 1, reference symbol 11 indicates a glass plate. This glass plate 11 is made of soda glass, heat-resistant glass, or quartz glass and so forth having a thickness of about 1 to 5 mm.

On this glass plate 11, a transparent electrically conductive film 12 that covers the entire surface of this glass plate 11 is provided. This transparent electrically conductive film 12 is composed of a thin film of tin-doped indium oxide (ITO), fluorine-doped tin oxide (FTO) and so forth that is both transparent and electrically conductive, has a thickness of about 0.2 to 1 µm, and is formed by a thin film formation method such as sputtering or CVD.

A grid 13 composed of a metal film is sealed on this transparent electrically conductive film 12. This grid 13, together with the aforementioned transparent electrically conductive film 12, functions as a pathway for electrons generated in an oxide semiconductor porous film when the electrically conductive glass is used in a dye-sensitized solar cell.

The planar shape of this grid 13 may be, for example, in the form of a lattice as shown in FIG. 2 or in the form of the teeth of a comb as shown in FIG. 3.

In the grid 13 in the form of a matrix as shown in FIG. 2, a countless number of rectangular openings 14, having a width of 450 to 2000 µm and length of 2000 to 20000 µm are formed, and the width of lines 15, which is composed of a metal film extending vertically and horizontally to form a matrix is 10 to 1000 µm. In addition, a wide collecting electrode 16 for collecting electricity is formed extending in the vertical direction on one side.

In the grid 13 in the form of the teeth of a comb shown in FIG. 3, a countless number of lines 15, which form the teeth of a comb, are composed of a metal film and have a width of 10 to 1000 µm, are formed mutually in parallel at an interval of 450 to 2000 µm, a countless number of openings 14 are formed, and a wide collecting electrode 16 for collecting electricity is formed on one of its ends.

This grid 13 is formed by a method such as a plating method and so forth, which is composed of a metal such as gold, silver, platinum, chromium, or nickel, or an alloy of two or more metals thereof, and the thickness of lines 15 is 1 to 20 µm, preferably 3 to 10 µm.

In addition, the numerical aperture of this grid 13 is made to be 90 to 99%. The numerical aperture referred to here is defined as the ratio of the total surface area of lines 15 to the unit surface area.

The total surface resistance of transparent electrically conductive film 12 and the grid 13 (referred to as the sheet resistance) over the entire surface of this electrically conductive glass is 1 to 0.01Ω/□, and is roughly $\frac{1}{10}$ to $\frac{1}{100}$ of that of transparent electrically conductive glass provided with a transparent electrically conductive film such as an ITO or FTO film. Consequently, this electrically conductive glass can be said to exhibit extremely high electrical conductivity.

Moreover, the entire surface of this type of electrically conductive glass has a high average optical transmittance ranging over the whole surface. Namely, this is because, since the electrically conductivity is improved considerably by the presence of the grid 13, the thickness of the transparent electrically conductive film 12 can be reduced, and since the numerical aperture of the grid 13 is 90 to 99%, there is hardly any blocking of incident light by the presence of the grid 13.

In this manner, the electrically conductive glass of this invention of a prior application has high electrical conductivity and transparency, and a dye-sensitized solar cell in which it is used has possibilities to exhibit a high photoelectric conversion efficiency.

However, in a dye-sensitized solar cell assembled using this electrically conductive glass, there may be backflow of electrons from the grid 13 to the electrolyte between grid 13 and the electrolyte resulting in the flow of leakage current. This is because the energy level of the electrolyte is lower than that of the grid 13, making a comparison between the energy levels of the grid 13 and the electrolyte.

In order to prevent this leakage current, a barrier layer, which is composed of a semiconductor or insulator such as titanium oxide or tin oxide, is further provided at the interface between the grid 13 and the electrolyte, and this barrier layer is expected to be able to inhibit leakage current that flows from the grid 13 towards the electrolyte.

This barrier layer can be formed by a method such as sputtering, complex sintering, spray pyrolysis and CVD.

However, in the case of a barrier layer obtained by this type of thin film formation method, there is the risk of the formation of slight pinholes, and even a single pinhole can result in the flow of leakage current.

In addition, since this barrier layer is also formed on the transparent electrically conductive film 12 other than the grid 13, when used in a dye-sensitized solar cell, the electrons generated in the oxide semiconductor porous film are obstructed from flowing to the transparent electrically conductive film 12, thereby causing a decrease in the amount of generated current or decrease in the fill factor (FF).

Although the barrier layer should only be formed on the grid 13 in order to resolve this problem, the problem of the pinholes remains, and their formation requires a bothersome process such as photolithography, thereby making this disadvantageous in terms of cost.

In addition, nickel is primarily used for the metal serving as the grid 13 in consideration of the manner in which it is formed. However, in the case of providing a grid 13 made of nickel directly on a transparent electrically conductive film 12 comprised of FTO and so forth, the nickel serving as the grid 13 penetrates into the transparent electrically conductive film 12 resulting in deterioration of the transparent electrically conductive film 12 during standing for a long period of time or when subjected to a heat treatment. Consequently, there was also a problem of electrons flowing back into the electrolyte from the transparent electrically conductive film 12, the leakage current flowing between the transparent electrically conductive film 12 and the electrolyte, thereby a significant decrease in the photoelectric conversion efficiency occuring when used in a dye-sensitized solar cell.

Accordingly, an object of the present invention is to provide electrically conductive glass in which a transparent electrically conductive film is provided on a glass and a grid includes a metal film is provided on this transparent electrically conductive film; wherein, when this electrically conductive glass is assembled in a dye-sensitized solar cell or other photoelectric conversion element, the generation of a leakage current flowing from the grid to an electrolyte as well as a leakage current flowing from the transparent electrically conductive film to the electrolyte are prevented.

DISCLOSURE OF THE INVENTION

In order to solve the aforementioned problems, an electrically conductive glass comprises a transparent electrically conductive film provided on a glass surface, and a grid including a passivated metal film provided on the transparent electrically conductive film.

The passivated metal is nickel, chromium, or cobalt, or an alloy of two or more species thereof.

The thickness of an oxide film formed oh the surface of the grid including a passivated metal film is about 10 to about 500 nm, preferably 10 to 500 nm.

The surface of the grid is of the passivated metal.

The electrically conductive glass may be manufactured by forming a transparent electrically conductive film on a glass surface, and forming a grid comprising a passivated metal film on the transparent electrically conductive film and heat-treating the grid at about 120 to about 550° C., preferably 120 to 550° C. in an oxygen atmosphere.

The electrically conductive glass may also comprise a transparent electrically conductive film provided on a glass surface, a diffusion-preventing film provided on the transparent electrically conductive film, and a grid including a metal film containing nickel provided on the diffusion-preventing film.

Also, the electrically conductive glass may comprise a transparent electrically conductive film provided on a glass surface, a grid including a metal film containing nickel, and a diffusion-preventing film provided on the grid and on the transparent electrically conductive film.

The diffusion-preventing film is formed from titanium, titanium oxide, niobium, or chromium.

The thickness of a diffusion-preventing film formed from titanium oxide is about 0.1 μm or less.

A photoelectric conversion element may comprise the electrically conductive glass embodiments of the present invention.

The photoelectric conversion element may be a dye-sensitized solar cell.

BEST MODE FOR CARRYING OUT THE INVENTION

First Embodiment

Figure 1:
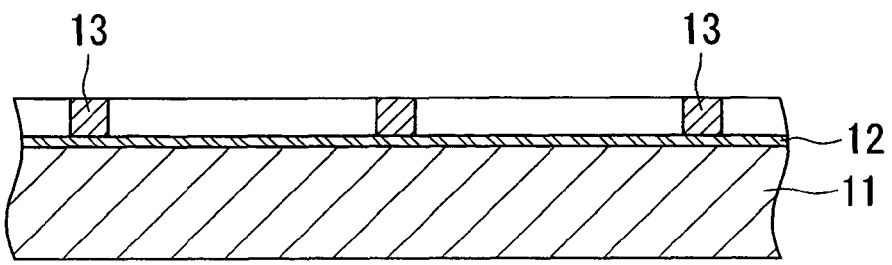
FIG. 1 is a schematic cross-sectional view showing an example of the electrically conductive glass.
Figure 2:
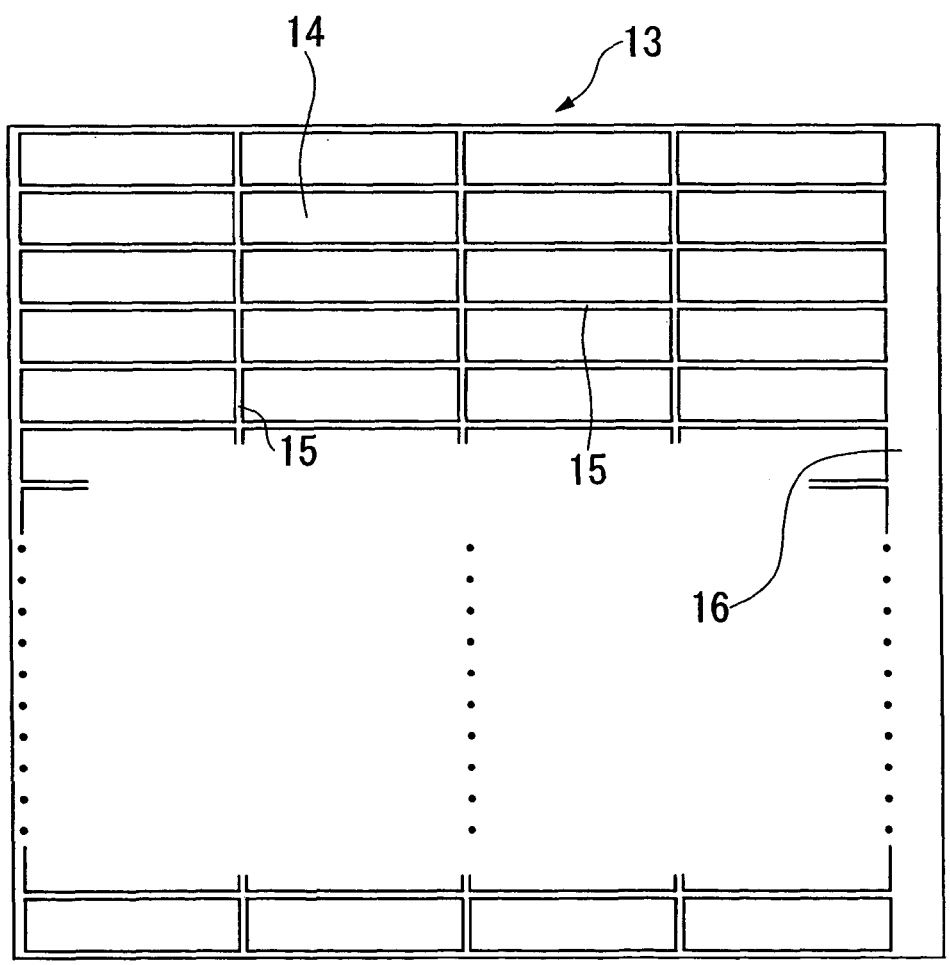
FIG. 2 is a plan view showing an example of the planar shape of a grid.
Figure 3:
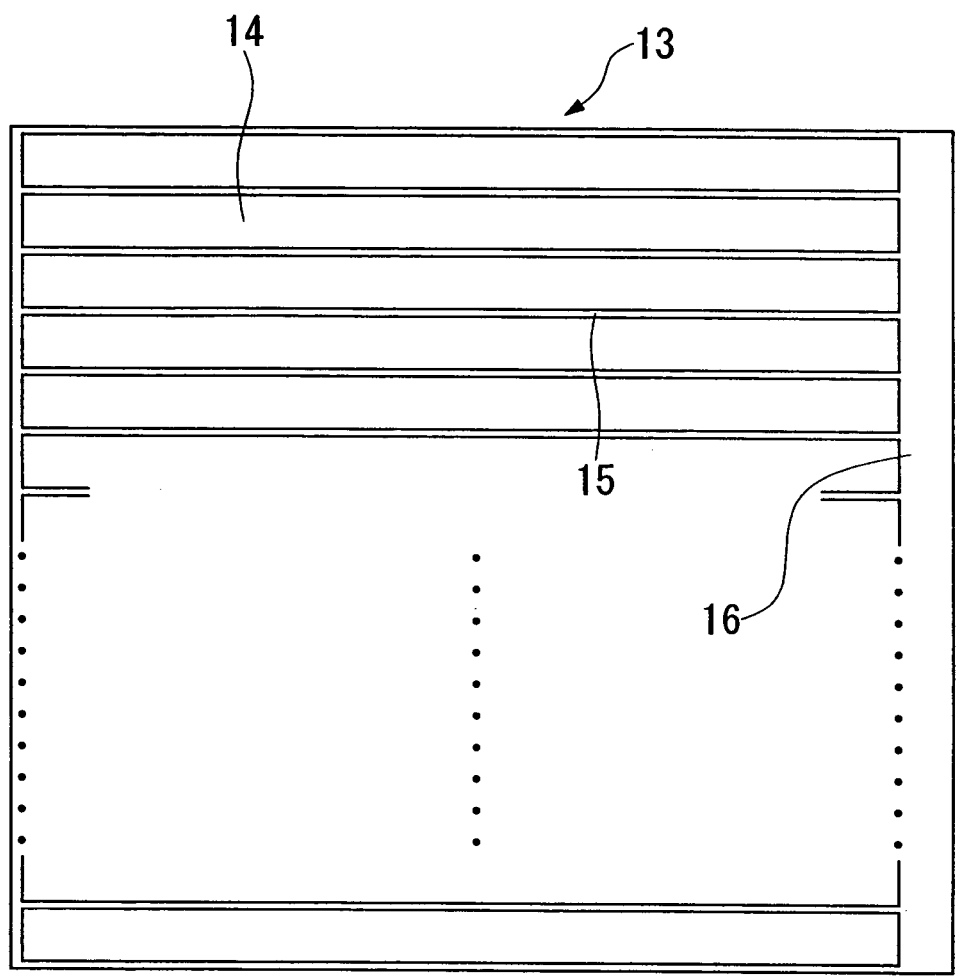
FIG. 3 is a plan view showing another example of the planar shape of a grid.

In a first example of the electrically conductive glass of the present invention, a metal film serving as a grid 13 is formed from a passivated metal on an electrically conductive glass having, for example, the structure shown in FIGS. 1 to 3.

The passivated metal in the present invention refers to a metal capable of forming a fine oxide film on its surface in air or other oxidizing atmosphere, an alloy of these passivated metals, or an alloy of this passivated metal and another metal. More specifically, examples of passivated metals include aluminum, chromium, nickel, cobalt, titanium, manganese, molybdenum, tungsten, zinc, tin, as well as alloys such as nickel-chromium alloy, iron-nickel-chromium alloy, aluminum-tungsten alloy, nickel-zinc alloy, and silver-zinc alloy.

Since a plating additive method is primarily employed as a method for forming the grid 13, among those metals, metals that can be plated are preferable, and further, since a low electrical resistance of grid 13 is preferable, metals having low volume resistivity such as nickel, chromium, cobalt, or their metal alloys are the most preferable.

In addition, the grid 13 may have a structure in which an inner layer includes a metal other than a passivated metal such as gold, silver, or platinum, while the surface includes the aforementioned passivated metal. The grid 13 in which only the surface is of a passivated metal can be formed by, for example, a method in which a grid precursor including a metal other than a passivated metal such as gold, silver, or platinum is first produced on a transparent electrically conductive film 12 by plating and so forth, followed by performing an electroless plating on this grid precursor to coat the precursor grid with a passivated metal such as nickel, chromium, or tin.

Although a plating additive method is preferable for the formation of the grid 13 including a passivated metal as previously described, it can also be formed by various types of thin film formation methods such as sputtering or vapor deposition.

In this type of grid 13 including a passivated metal, an electrically insulated oxide film is formed naturally on the surface of the grid 13 immediately after its formation, and this insulated oxide film serves as a barrier layer that functions as a leakage current preventive layer. In addition, in assembling a dye-sensitized solar cell using this electrically conductive glass, since the electrically conductive glass is exposed to high temperatures when an oxide semiconductor porous film including titanium oxide and so forth is formed on the electrically conductive glass by the sintering method, an oxide film having an adequate thickness is formed on the surface of the grid 13 which serves as an effective barrier.

Although it is possible to wait for natural oxidation as described above to form the oxide film on the surface of the grid 13, the oxide film may preferably be formed aggressively by performing a heat treatment in an oxygen atmosphere. This heat treatment is carried out under conditions of a temperature of about 120 to about 550° C. and preferably about 150 to about 450° C., and a treatment duration of 5 to 120 minutes and preferably 10 to 90 minutes, while the heat treatment varying according to the type of passivated metal. If the temperature is lower than about 120° C. and the treatment duration is less than 5 minutes, it is not possible to obtain the oxide film of adequate thickness, while if the temperature exceeds about 550° C., the glass plate 11 itself ends up melting. If the treatment duration exceeds about 120 minutes, it essentially becomes superfluous, thereby making this uneconomical.

As previously described, this heat treatment can also be carried out by baking at the same temperature and treatment duration when forming the oxide semiconductor porous film including titanium oxide and so forth by baking.

The thickness of an oxide film formed in this manner is roughly about 10 to about 500 nm. If the thickness is less than about 100 nm, leakage current preventive effects are unable to be obtained, while if the thickness exceeds about 500 nm, the desired effects reach a maximum resulting in prolongation of the treatment duration for forming the oxide film, thereby making this impractical.

Figure 4:
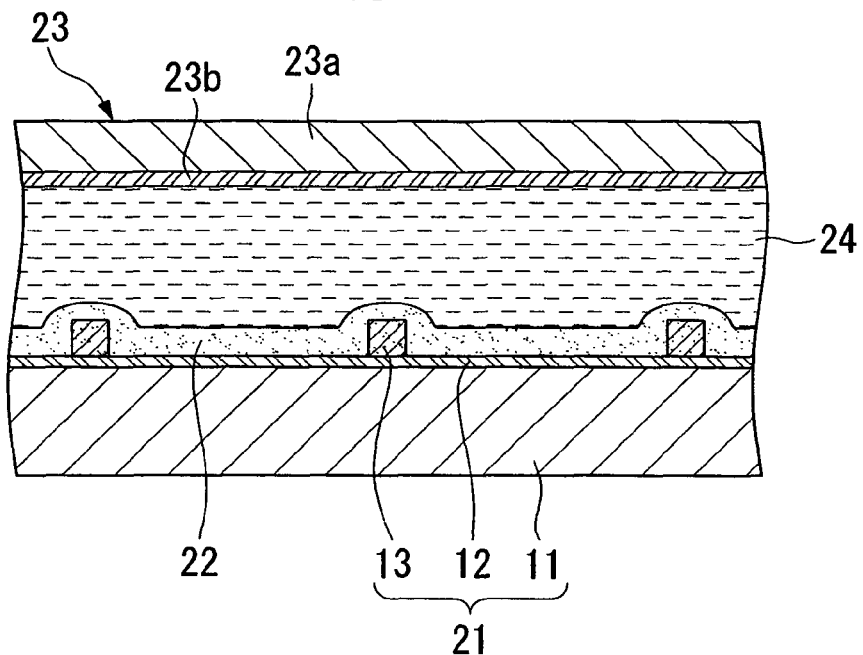
FIG. 4 is a schematic cross-sectional view showing an example of a dye-sensitized solar cell in which the electrically conductive glass of the present invention is used.

FIG. 4 shows an example of a dye-sensitized solar cell in the form of a photoelectric conversion element in which this type of electrically conductive glass is used.

In FIG. 4, reference symbol 21 is the electrically conductive glass shown in FIGS. 1 to 3. An oxide semiconductor porous film 22 is provided on the grid 13 including a passivated metal of this electrically conductive glass 21.

This oxide semiconductor porous film 22 is a porous body including metal oxide fine particles which are connected with each other and demonstrate semiconductivity such as titanium oxide, tin oxide, tungsten oxide, zinc oxide, zirconium oxide, or niobium oxide and having countless fine pores inside and fine irregularities in its surface, and having a thickness of about 5 to about 50 μm.

As shown in FIG. 4, this oxide semiconductor porous film 22 fills in the openings 14 of grid 13, covers the entire surface of grid 13 and is integrally bonded with the grid 13.

Formation of this oxide semiconductor porous film 22 is carried out using a method, for example, in which a colloidal liquid or dispersion in which is dispersed fine particles of the aforementioned metal oxide having an average particle diameter of 5 to 50 nm is coated onto the surface of the grid 13 by a coating method such as screen printing, ink jet printing, roll coating, doctor coating, or spray coating followed by sintering at 300 to 800° C.

In addition, a photosensitive dye is adsorbed to this oxide semiconductor porous film 22. Ruthenium complexes containing ligands such as a bipyridine structure or terpyridine structure, metal complexes such as porphyrin or phthalocyanine, or organic dyes such as eosin, rhodamine, or merocyanine are used for this photosensitive dye, and it can be suitably selected according to its application, type of metal oxide semiconductor, and so forth.

In addition, reference symbol 23 indicates a counter electrode. In this example, as the counter electrode 23, a counter electrode is used, in which an electrically conductive thin film 23b composed of platinum or gold and so forth is formed by vapor deposition or sputtering deposition and so forth on the surface of a metal-clad of a metal-clad laminated film 23a in which the metal-clad such as a copper foil or a nickel foil is laminated on one side of a polyimide, polyethylene terephthalate, or other plastic film, and in the dye-sensitized solar cell of the present example, the electrically conductive thin film 23b is arranged so as to be on the inside of the solar cell.

In addition, a counter electrode in which an electrically conductive film 23b made of platinum, gold, carbon, and so forth is formed on an electrically conductive substrate such as a metal plate or a non-electrically conductive substrate 23a such as a glass plate may also be used for counter electrode 23. In addition, in the case of using a p-type semiconductor as a hole transport layer, since the p-type semiconductor is a solid, a platinum or other electrically conductive film can be formed by vapor deposition or sputtering directly thereon and this electrically conductive film can also be used as counter electrode 23.

An electrolyte is filled into the space between this counter electrode 23 and the oxide semiconductor porous film 22 of the electrically conductive glass 21 to form an electrolyte layer.

There are no particular limitations on this electrolyte provided it is a non-aqueous electrolyte that contains a redox pair. Examples of solvents that are used include acetonitrile, methoxyacetonitrile, propionitrile, ethylene carbonate, propylene carbonate, and γ-butyrolactone.

Combinations such as iodine and iodide ion or bromine and bromide ion can be selected for the redox pair, and examples of counter ions that can be used in the case of adding those combinations in the form of a salt include lithium ion, tetraalkyl ion, and imidazolium ion. In addition, iodine and so forth may also be added as necessary.

In addition, this electrolyte may also be used in the form of a solid by gelling with a suitable gelling agent.

In addition, instead of an electrolyte 24, a hole transport layer composed of p-type semiconductor may also be used. A monovalent copper compound such as copper iodide or copper thiocyanide or an electrically conductive polymer such as polypyrrole can be used for this p-type semiconductor, with copper iodide being particularly preferable. There is no risk of leakage of electrolyte when using this solid hole transport layer composed of a p-type semiconductor and gelled electrolyte.

Since the grid 13 including a film of a passivated metal is provided on the transparent electrically conductive film 12 in this type of electrically conductive glass, it exhibits both high electrical conductivity and high transparency. In addition, since the grid 13 is including the passivated metal, a fine, insulated oxide film is formed on its surface, and this oxide film functions as a barrier layer that prevents the generation of leakage current. Moreover, erosion of the grid 13 by electrolyte can also be prevented by this oxide film.

In addition, since this oxide film is extremely fine, there is hardly any formation of pin holes in the coating film, thereby eliminating the risk of leakage current caused by the presence of pin holes. Moreover, since a special barrier layer is not required to be formed on the grid 13, there is the advantage of improved workability and reduced costs.

Second Embodiment

Figure 5:
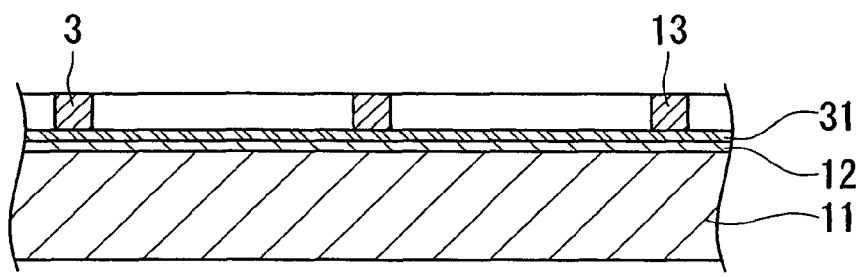
FIG. 5 is a schematic cross-sectional view showing another example of the electrically conductive glass of the present invention.

FIG. 5 is a schematic cross-sectional view showing a second example of the electrically conductive glass of the present invention. The same reference symbols are used to indicate those constituent features that are the same as the constituent features of the electrically conductive glass shown in FIGS. 1 to 3, and their explanations are omitted.

The electrically conductive glass of this example has a diffusion-preventing film 31 provided on a transparent electrically conductive film 12, and a grid 13 including a film of a metal containing nickel provided on this diffusion-preventing film 31 in the electrically conductive glass having, for example, the structure shown in FIGS. 1 to 3.

Diffusion-preventing film 31 is provided between the transparent electrically conductive film 12 and the grid 13 to prevent the penetration and diffusion of nickel contained in the metal film that forms the grid 13 into an FTO and so forth that forms transparent electrically conductive film 12, and although any material can be used if it is highly adhesive with ITO, FTO, and so forth and has high adhesion with other metals, it is preferably formed from, for example, titanium, titanium oxide, niobium, or chromium. Titanium oxide is particularly preferable since it has superior weather resistance, heat resistance, and chemical resistance, has extremely high chemical stability, and does not have an effect on power generation characteristics (such as photoelectric conversion efficiency) when the electrically conductive glass is applied to a dye-sensitized solar cell, while titanium is even more preferable since it becomes stable titanium oxide as a result of sintering.

A thickness of diffusion-preventing film 31 is about 0.005 to about 0.2 μm and preferably about 0.01 to about 0.03 μm. If the thickness of diffusion-preventing film 31 is less than about 0.005 μm, penetration and diffusion of the nickel contained in the metal film that forms the grid 13 into the FTO and so forth that forms transparent electrically conductive film 12 cannot be prevented. On the other hand, if the thickness of diffusion-preventing film 31 exceeds about 0.2 μm, there is the risk of a decrease in the photoelectric conversion efficiency in the case of applying the electrically conductive glass to a dye-sensitized solar cell. In particular, in the case in which the diffusion-preventing film 31 is formed with titanium oxide, its thickness is preferably about 0.1 μm or less and more preferably about 0.01 to about 0.03 μm. In this manner, if the diffusion-preventing film 31 is formed from titanium oxide, there is no deterioration in power generation characteristics even if its thickness is extremely thin, and the nickel contained in the metal film that forms the grid 13 can be prevented from penetrating and diffusing into the FTO and so forth that forms transparent electrically conductive film 12.

Next, an explanation is provided of an example of a production process of this type of electrically conductive glass.

Figure 6:
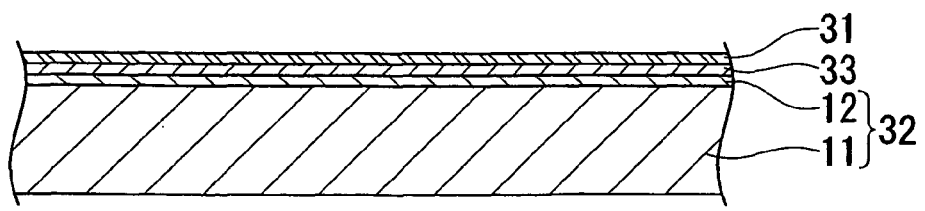
FIG. 6 is a schematic cross-sectional view showing a method of manufacturing the electrically conductive glass of the present example.

First, a transparent electrically conductive glass 32 is prepared, wherein a transparent electrically conductive film 12, such as ITO or FTO, and so forth, is provided on the glass substrate 11 shown in FIG. 6. This type of transparent electrically conductive glass 32 is available commercially, and can be acquired from such firms as Asahi Glass Co., Ltd. and Nippon Sheet Glass Co., Ltd.

The surface of transparent electrically conductive film 12 of this transparent electrically conductive glass 32 is cleaned by plasma cleaning, and a seed layer 33 is provided thereon by sputtering silver, chromium, nickel, or gold. Next, the surface of this seed layer 33 is cleaned by plasma cleaning, and a diffusion-preventing layer 31 is formed thereon by sputtering titanium, titanium oxide, niobium, or chromium.

Figure 7:
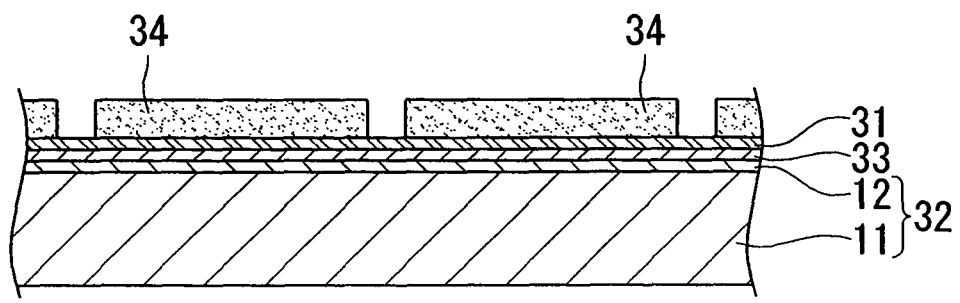
FIG. 7 is a schematic cross-sectional view showing a method of manufacturing the electrically conductive glass of the present example.

Next, a dry resist film is placed on this diffusion-preventing film 31 followed by exposure and development to form a mask 34 having a pattern in the planar shape of the grid 13 as shown in FIG. 7, and additionally followed by baking and an activation treatment.

Figure 8:
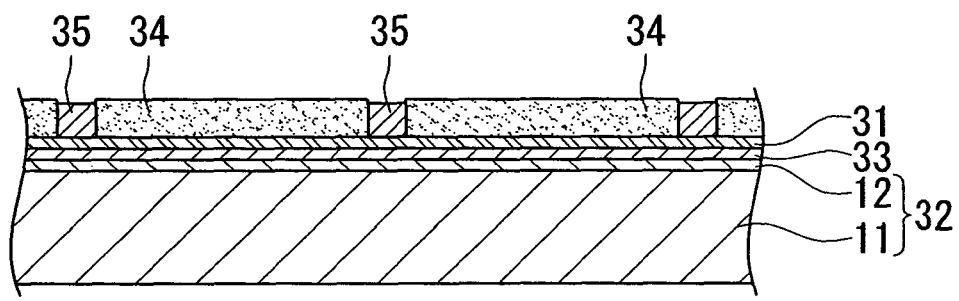
FIG. 8 is a schematic cross-sectional view showing a method of manufacturing the electrically conductive glass of the present example.

Subsequently, nickel plating is performed on the diffusion-preventing layer 31 that is exposed through the mask 34 by using the diffusion-preventing layer 31 as one of electrodes to form a nickel layer 35 to serve as the grid 13 as shown in FIG. 8. When performing this nickel plating, a method in which strike plating is first performed at a high current density followed by electrolytic nickel plating at a normal current density is preferable for improving adhesion. Examples of electrolytic nickel plating solutions used for this electrolytic nickel plating include nickel sulfamate using sulfamic acid as a solvent, Watt's bath (nickel sulfate) and chloride bath (nickel chloride).

Subsequently, the remaining mask 34 is peeled off and removed and the entire structure is heated to anneal the nickel layer 35 serving as the grid 13, the diffusion-preventing film 31 beneath this nickel layer 35, and the seed layer 33 into an alloy. Furthermore, the diffusion-preventing layer 31 and the seed layer 33 beneath the mask 34 may be suitably removed by etching.

Next, the electrically conductive glass having the structure shown in FIG. 5 is obtained by cleaning the entire structure.

Furthermore, in this method of manufacturing the electrically conductive glass, the grid 13 may be formed by processing the nickel layer 35 to a desired shape by dry etching after forming this nickel layer 35 over the entire surface of the diffusion-preventing film 31 without providing the mask 34 as previously described. In the past, in the case of removing a nickel layer formed on a transparent electrically conductive film composed of FTO and so forth by dry etching, since the ratio of the etching speed of nickel to the etching speed of the transparent electrically conductive film composed of FTO is about 1/6, etching ended up being performed excessively to remove unevenness in the case of unevenness in the thickness of the nickel layer or unevenness of the etching, thereby resulting in deterioration of the transparent electrically conductive film caused by over-etching at portions where the nickel layer had already been removed.

On the other hand, since the ratio of the etching speed of titanium to the etching speed of nickel is about 1/5, even if there is unevenness in the thickness of the nickel layer or unevenness of the etching, etching stops at the titanium layer (the diffusion-preventing film) until the nickel layer is completely removed, thereby preventing over-etching of the transparent electrically conductive film.

Thus, in this production process, since the diffusion-preventing film 31 including titanium and so forth is provided between the transparent electrically conductive film 12 and the nickel layer 35, there is no deterioration of the transparent electrically conductive film 12 caused by this over-etching.

In addition, although the diffusion-preventing film 31 should at least be provided only between the transparent electrically conductive film 12 and the nickel layer 35, it is preferably provided over the entire surface of the transparent electrically conductive film 12.

As was previously described, during the production of the electrically conductive glass of the present invention, the grid 13 may be formed by processing the nickel layer 35 to a desired shape by dry etching after forming this nickel layer 35 over the entire surface of the diffusion-preventing film 31 without providing a mask 34. Consequently, if the diffusion-preventing film 35 is only formed between the transparent electrically conductive film 12 and the nickel layer 35 serving as the grid 13, since the transparent electrically conductive film 12 and the nickel layer 35 that is subsequently removed by etching temporarily make contact, thereby resulting in the risk of the nickel that forms the nickel layer 35 penetrating and diffusing into the FTO and so forth that forms the transparent electrically conductive film 12. Thus, the diffusion-preventing film 31 preferably is provided over the entire surface of the transparent electrically conductive film 12.

Moreover, there is no deterioration of the power generation characteristics of the electrically conductive glass even if the diffusion-preventing film 31 other than the portion beneath the grid 13 is left on the transparent electrically conductive film 12 without removing by etching.

In the electrically conductive glass shown in FIG. 5, the diffusion-preventing film 31 is provided on the transparent electrically conductive film 12 that is provided on the surface of glass plate 11, and although the grid 13 is provided on this diffusion-preventing film 31, it is not limited to this.

As a variation of this second embodiment, the grid 13 is provided on the transparent electrically conductive film 12 that is provided on the surface of the glass plate 11, and the diffusion-preventing film 31 is provided on this grid 13 and on the transparent electrically conductive film 12.

In the production process for this variation of an electrically conductive glass, after forming a metal film containing nickel to serve as the grid 13 on a foreface of the transparent electrically conductive film 12, in the step in which the excess metal film is removed by etching to form the grid 13, there is the risk of nickel penetrating the transparent electrically conductive film 12 resulting in the possibility of deterioration of the transparent electrically conductive film 12 and the flow of leakage current. However, in the electrically conductive glass of this variation, since the diffusion-preventing film 31 is provided over the entire surface of the grid 13 and the transparent electrically conductive film 12, the leakage current flowing from the transparent electrically conductive film 12 to the electrolyte can be prevented even if there is deterioration of the transparent electrically conductive film 12.

In the production of the electrically conductive glass of this variation, for example, a dry resist film is placed on the transparent electrically conductive film 12 provided on the surface of the glass plate 11 followed by exposure and development to form a mask having a pattern in the planar shape of the grid 13, and additionally followed by baking and an activation treatment.

Subsequently, nickel plating is performed on the transparent electrically conductive film 12 that is exposed through the mask using the transparent electrically conductive film 12 as one of the electrodes to form a nickel layer to serve as the grid 13. Subsequently, the remaining mask is peeled off and removed and the entire structure is heated to anneal the nickel layer serving as the grid 13 and the transparent electrically conductive film 12 located beneath this nickel layer into an alloy. Next, the diffusion-preventing film 31 is formed on the grid 13 and on the transparent electrically conductive film 12 by sputtering titanium, titanium oxide, niobium, or chromium.

In producing a photoelectric conversion element in the form of a dye-sensitized solar cell using this type of electrically conductive glass, the same process as the previous first embodiment is used as shown in FIG. 5 with the exception providing the diffusion-preventing film 31 on the transparent electrically conductive film 12, and providing the grid 13 on this diffusion-preventing film 31, and an explanation thereof is omitted.

In an electrically conductive glass having this type of constitution, since a diffusion-preventing film 31 including titanium or titanium oxide is provided between the transparent electrically conductive film 12 including FTO and so forth and the grid 13 including a metal film containing nickel, penetration and diffusion of the nickel that composes the grid 13 into the FTO and so forth that forms the transparent electrically conductive film 12 can be prevented, thereby making it possible to prevent the generation of leakage current that flows to the electrolyte from the transparent electrically conductive film 12. In addition, as a result of providing the diffusion-preventing film 31, in the case of forming the grid 13 by etching a metallic thin film formed on the diffusion-preventing film 31, deterioration of the transparent electrically conductive film 12 caused by over-etching can be prevented.

However, although the invention will be explained below in more detail by reference to the following Examples, the invention should not be construed as being limited to the following Examples only. It is to be expressly understood, that the Examples and Figures are for purpose of illustration only and are not intended as a definition of the limits of the invention.

Example 1

This Example 1 corresponds to the previously described first embodiment.

A transparent electrically conductive glass was prepared in which a transparent electrically conductive film composed of FTO having a thickness of 0.5 μm was provided on a glass plate having a thickness of 2 mm.

A lattice-shaped grid like that shown in FIG. 2 was provided on the aforementioned FTO of this transparent electrically conductive glass. The types of metal that served as the grid along with their formation methods were as indicated below, however, a barrier layer composed of titanium oxide or FTO was formed for some of the metals for the sake of comparison.

| No. | Metal | Formation Method | |
|---|---|---|---|
| 1 | Aluminum | Vapor deposition | |
| 2 | Titanium | Sputtering | |
| 3 | Chromium | Plating | |
| 4 | Cobalt | Plating | |
| 5 | Nickel | Plating | |
| 6 | Gold | Plating | |
| 7 | Platinum | Plating | |
| 8 | Silver | Plating | |
| 9 | Platinum | Plating | Formation of barrier layer composed of titanium oxide |
| 10 | Gold | Plating | Formation of barrier layer composed of titanium oxide |
| 11 | Silver | Plating | Formation of barrier layer composed of titanium oxide |
| 12 | Gold | Plating | Formation of barrier layer composed of FTO |
| 13 | Silver | Plating | Formation of barrier layer composed of FTO |

The thickness of the grid lines was 5 μm, the line width was 40 μm, the size of the openings was 860 μm wide and 5000 μm long, and the numerical aperture was 95%.

The sheet resistance of the electrically conductive glass obtained in this manner was 0.1 to 0.8Ω/□, and the optical transmittance at a wavelength of 550 nm was 75 to 80%.

Next, an oxide semiconductor porous film was formed on the grid of this electrically conductive glass. The formation of this oxide semiconductor porous film was carried out by dispersing titanium oxide fine particles having a particle diameter of about 20 nm in acetonitrile to form a paste, coating this onto the aforementioned grid using the bar code method to a thickness of 15 μm, and then drying followed by baking for 1 hour at 400° C. Following baking, ruthenium dye was adsorbed to the oxide semiconductor porous film.

A transparent electrically conductive glass in which FTO having a thickness of 5 μm was provided on a glass plate having a thickness of 2 mm was prepared for the counter electrode, and the aforementioned electrically conductive glass was then laminated onto the counter electrode and an iodine/iodide electrolyte was filled in the space between them to serve as the electrolyte layer, thereby producing dye-sensitized solar cells.

The planar dimensions of the resulting solar cells were 10 mm×10 mm.

The leakage current flowing from the grid to the electrolyte was measured for these solar cells. The measurement was performed by connecting a bipolar power supply to the cell and measuring the amount of current while sweeping over a voltage range of 0 to 1 V.

Those results are shown in Table 1.

The dry corrosion resistance shown in Table 1 is referred to as an evaluation of surface state when the metal was oxidized by heating at a high temperature, and this was evaluated with a C when the surface was slightly roughened, a B when the surface was hardly roughened at all, or an A when there was no roughening of the surface whatsoever. In addition, the iodine resistance is referred to as the chemical resistance to an electrolyte in which the redox pair consists of iodine and iodine ions, and was evaluated with a B when a metal film having a thickness of 50 nm formed on the surface of the grid was not removed by contact with the electrolyte for 1 month, or with an D when it was removed.

In addition, a leakage current was evaluated with an A when the the leakage current during a sweep voltage of 500 mV was less than 0.01 mA/cm², with a B when the above leakage current was 0.01 to 0.05 mA/cm², with a C when the above leakage current exceeded 0.05 mA/cm² and was up to 0.5 mA/cm², and with a D when the above leakage current exceeded 0.5 mA/cm².

Based on the results of Table 1, nickel was determined to be the most preferable for the passivated metal to serve as the grid, and aluminum was determined to be the next most preferable.

TABLE 1

|   | Dry Corrosion Resistance | Iodine Resistance | Leakage Current |
|---|---|---|---|
| 1 | C (white dots) | B | A |
| 2 | B (inter-fering color) | B | B |
| 3 | B (black) | B | B |
| 4 | B (black) | B | B |
| 5 | B (black) | B | A |
| 6 | A | B | D |
| 7 | A | B | D |
| 8 | B (white dots) | D | — |
| 9 | — | B | C |
| 10 | — | B | C |
| 11 | — | B | C |
| 12 | — | B | D |
| 13 | — | B | C |

In Example 2, a study was made of the thickness and formation conditions of the oxide film on the surface of the passivated metal serving as the grid corresponding to the aforementioned first embodiment.

First, two types of sample cells were produced.

Sample Cell A:

A substrate on the working electrode side was prepared in which a transparent electrically conductive film having a thickness of 500 nm and composed of FTO was formed on the surface of a glass plate having a thickness of 2.0 mm, a glass plate having a thickness of 2.0 mm on which was laminated a platinum foil having a thickness of 0.05 mm was used for the substrate on the counter electrode side, these two substrates were then sealed followed by filling an iodine/iodide electrolyte into the space between the substrates for use as Sample Cell A.

Sample Cell B:

For the substrate on the working electrode side, a transparent electrically conductive film having a thickness of 500 nm and composed of FTO was formed on the surface of a glass plate having a thickness of 2.0 mm, and a film to serve as the grid having a thickness of 1 μm composed of various passivated metals (nickel, chromium, aluminum, cobalt, or titanium) was formed on this transparent electrically conductive film by plating to serve as the substrate on the working electrode side. This substrate was then heat-treated in air under conditions of a temperature of 120 to 450° C. and a treatment duration of 5 to 120 minutes. Sample Cell B was then produced in the same manner as Sample Cell A with the exception of using this substrate for the working electrode side. The leakage current flowing from the transparent electrically conductive film to the electrolyte was measured for Sample Cell A, while the leakage current flowing from the grid to the electrolyte was measured for Sample Cell B. The leakage current was measured by connecting a bipolar power supply between the transparent electrically conductive film and the platinum foil for both sample cells, and measuring the leakage current while sweeping over an applied voltage range of −1 to +1 V.

The amount of leakage current was evaluated based on the amount of current at a sweep voltage of +0.5 V.

The leakage current value of Sample Cell B was evaluated with a D when it was larger than the leakage current value of Sample Cell A used as a reference value, evaluated with a C when they were roughly the same, evaluated with a B when it was smaller than the reference value, and evaluated with an A when it was one-tenth or less of the reference value.

The relationships of the type of passivated metal and the heat treatment conditions to those evaluations are shown in Tables 2 to 6.

TABLE 2

| Ni | | Duration of heat treatment | | | | | |
|---|---|---|---|---|---|---|---|
| | | 5 min. | 10 min. | 30 min. | 60 min. | 90 min. | 120 min. |
| Heat treatment temp. | 120° C. | D | D | D | D | D | C |
| | 150° C. | D | C | C | B | B | B |
| | 200° C. | C | B | B | B | A | A |
| | 300° C. | B | B | A | A | A | A |
| | 450° C. | A | A | A | A | A | A |

TABLE 3

| Cr | | Duration of heat treatment | | | | | |
|---|---|---|---|---|---|---|---|
| | | 5 min. | 10 min. | 30 min. | 60 min. | 90 min. | 120 min. |
| Heat treatment temp. | 120° C. | D | D | D | D | D | C |
| | 150° C. | D | D | C | C | C | B |
| | 200° C. | D | C | B | B | B | B |
| | 300° C. | B | B | B | B | B | B |
| | 450° C. | B | B | B | B | A | A |

TABLE 4

| Co | | Duration of heat treatment | | | | | |
|---|---|---|---|---|---|---|---|
| | | 5 min. | 10 min. | 30 min. | 60 min. | 90 min. | 120 min. |
| Heat treatment temp. | 120° C. | D | D | D | D | D | D |
| | 150° C. | D | D | D | D | D | D |
| | 200° C. | D | D | D | D | D | C |
| | 300° C. | D | D | C | C | C | B |
| | 450° C. | C | C | B | B | B | B |

TABLE 5

| Al | | Duration of heat treatment | | | | | |
|---|---|---|---|---|---|---|---|
| | | 5 min. | 10 min. | 30 min. | 60 min. | 90 min. | 120 min. |
| Heat treatment temp. | 120° C. | D | D | D | D | D | C |
| | 150° C. | C | C | B | B | B | B |
| | 200° C. | C | B | B | B | B | B |
| | 300° C. | B | B | B | B | A | A |
| | 450° C. | B | B | A | A | A | A |

TABLE 6

| Ti | | Duration of heat treatment | | | | | |
|---|---|---|---|---|---|---|---|
| | | 5 min. | 10 min. | 30 min. | 60 min. | 90 min. | 120 min. |
| Heat treatment temp. | 120° C. | D | D | D | C | C | C |
| | 150° C. | D | C | C | B | B | B |
| | 200° C. | C | B | B | B | B | A |
| | 300° C. | B | B | B | A | A | A |
| | 450° C. | B | A | A | A | A | A |

On the basis of the results shown in these tables, the leakage current was determined to decrease and an oxide film of adequate thickness for preventing the current leakage was determined to be formed on the surface of the passivated metal serving as the grid during a heat treatment of 120 to 450° C. for a duration of 5 to 120 minutes regardless of the type of passivated metal. Moreover, when the grid surface was observed, following the heat treatment, with a field effect scanning electron microscope, the thickness of the oxide film was determined to be about 10 nm for sample cells evaluated with C's in Tables 2 to 6, about 50 nm for sample cells evaluated with B's, and about 100 nm for sample cells evaluated with A's.

Furthermore, cells evaluated as C or better are required when applying to an actual dye-sensitized solar cell.

Example 3

Example 3 corresponds to the aforementioned second embodiment.

A commercially available electrically conductive glass (Asahi Glass Co., LTD.) was prepared in which a transparent electrically conductive film having a thickness of 0.5 μm and composed of FTO was provided on a glass plate having a thickness of 2 mm.

A seed layer having a thickness of 0.05 μm and composed of nickel was formed on the FTO of this transparent electrically conductive film by sputtering.

Next, a diffusion-preventing film having a thickness of 0.025 μm and composed of titanium or chromium was formed on this seed layer by sputtering.

Next, after plating nickel onto this diffusion-preventing film using a nickel sulfamate solution in the same manner as the previously described production process, a heat treatment was carried out at 450° C. to provide a lattice-shaped grid composed of nickel as shown in FIG. 2 and an electrically conductive glass was produced. At this time, the duration of heat treatment performed on the nickel plate was 0, 30, 60, or 120 minutes.

For the sake of comparison, an electrically conductive glass was produced by only providing a seed layer composed of nickel without providing a diffusion-preventing film, and then providing a grid composed of nickel on this seed layer.

The thickness of the grid lines was 5 μm, the line width was 40 μm, the size of the openings was rectangular measuring 860 μm in height and 5000 μm in width, and the numerical aperture was 95%.

The sheet resistance of the electrically conductive glass obtained in this manner was 0.1Ω/□, and an optical transmittance at a wavelength of 550 nm was 75 to 80%.

Next, an oxide semiconductor porous film was formed on the grid of this electrically conductive glass. The formation of this oxide semiconductor porous film was carried out by dispersing titanium oxide fine particles having a particle diameter of about 20 nm in acetonitrile to form a paste, coating this onto the aforementioned grid using the bar code method to a thickness of 15 μm, and then drying followed by baking for 1 hour at 400° C. Following baking, ruthenium dye was adsorbed to the oxide semiconductor porous film.

A transparent electrically conductive glass in which FTO having a thickness of 5 μm was provided on a glass plate having a thickness of 2 mm was prepared for a counter electrode, and the aforementioned electrically conductive glass was then laminated onto the counter electrode and an iodine/iodide electrolyte was filled in the space between them to serve as the electrolyte layer, thereby producing dye-sensitized solar cells.

The planar dimensions of the resulting solar cells were 10 mm×10 mm.

The leakage current flowing from the transparent electrically conductive film to the electrolyte was measured for these solar cells. Measurement was performed by connecting a bipolar power supply to the cell and measuring the amount of current while sweeping over a voltage range of −1 to +1 V.

Figure 9:
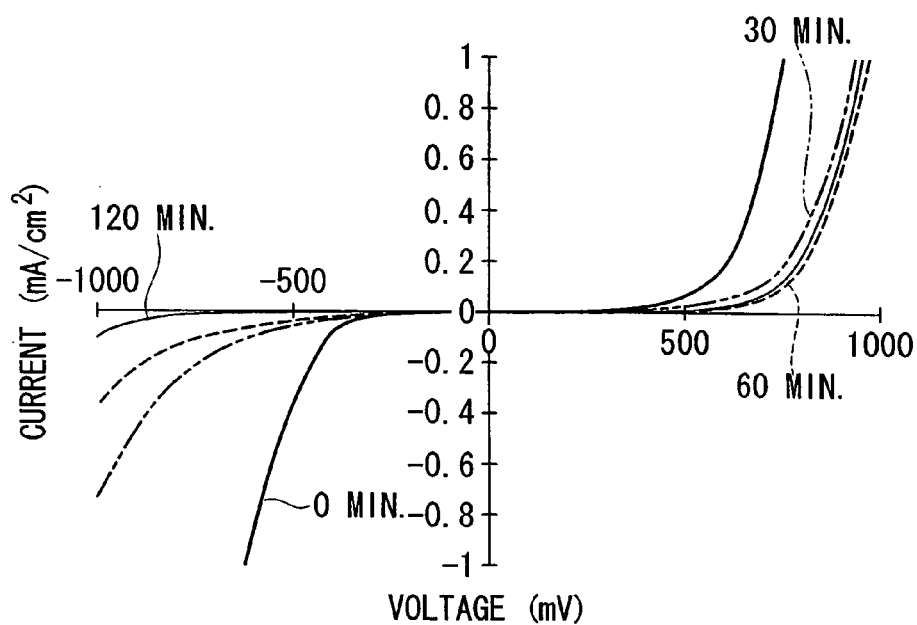
FIG. 9 is a graph showing the results of measuring a leakage current of an example of the electrically conductive glass of the present invention in which a diffusion-preventing film is formed from titanium.
Figure 10:
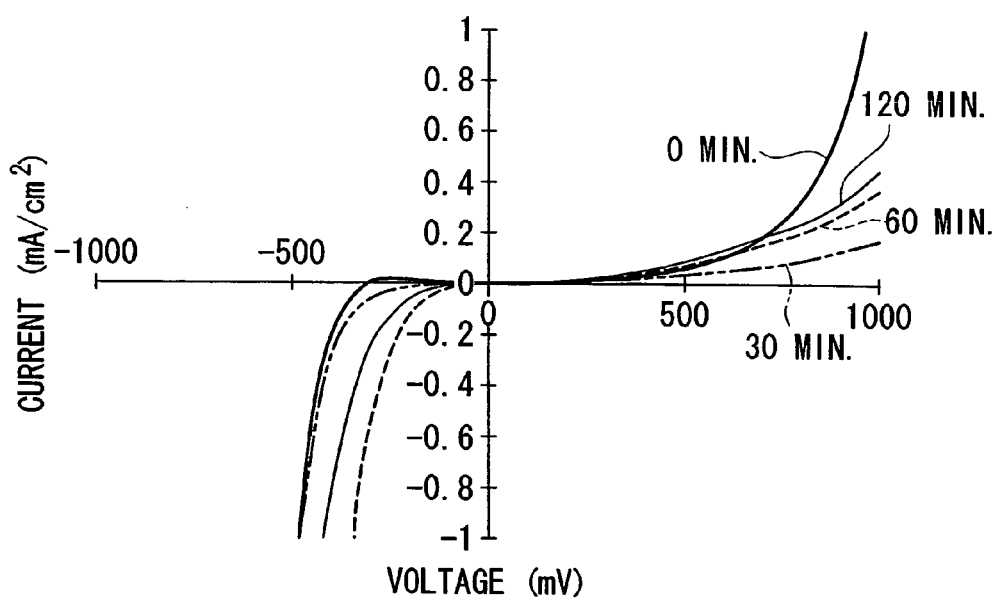
FIG. 10 is a graph showing the results of measuring a leakage current of an example of the electrically conductive glass of the present invention in which a diffusion-preventing film is formed from chromium.
Figure 11:
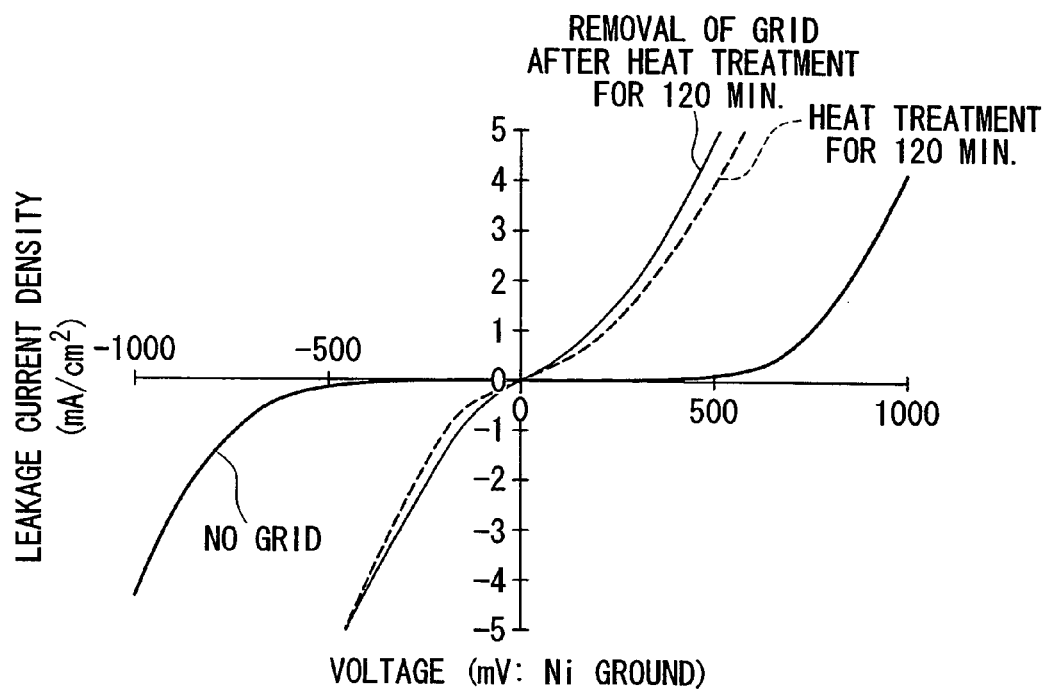
FIG. 11 is a graph showing the results of measuring a leakage current of an example of the electrically conductive glass that is not provided with a diffusion-preventing film.

Those results are shown in FIGS. 9 to 11.

FIG. 9 shows the results of measuring the leakage current of a dye-sensitized solar cell in which an electrically conductive glass provided with a diffusion-preventing film composed of titanium is used, and based on the results of this graph, the leakage current was confirmed to not increase even when the heat treatment was performed on the electrically conductive glass provided with the diffusion-preventing film composed of titanium. In particular, there was hardly any generation of leakage current at voltages of 500 mV or lower.

FIG. 10 shows the results of measuring the leakage current of a dye-sensitized solar cell in which an electrically conductive glass provided with a diffusion-preventing film composed of chromium is used, and based on the results of this graph, the leakage current was confirmed to not increase even when the heat treatment was performed on the electrically conductive glass provided with the diffusion-preventing film composed of chromium. In particular, there was hardly any generation of leakage current at voltages of 500 mV or lower.

FIG. 11 shows the results of measuring the leakage current of a dye-sensitized solar cell in which an electrically conductive film not provided with a diffusion-preventing film is used, and based on the results of this graph, the leakage current was confirmed to increase when the heat treatment was performed after providing a grid composed of nickel.

Figure 12:
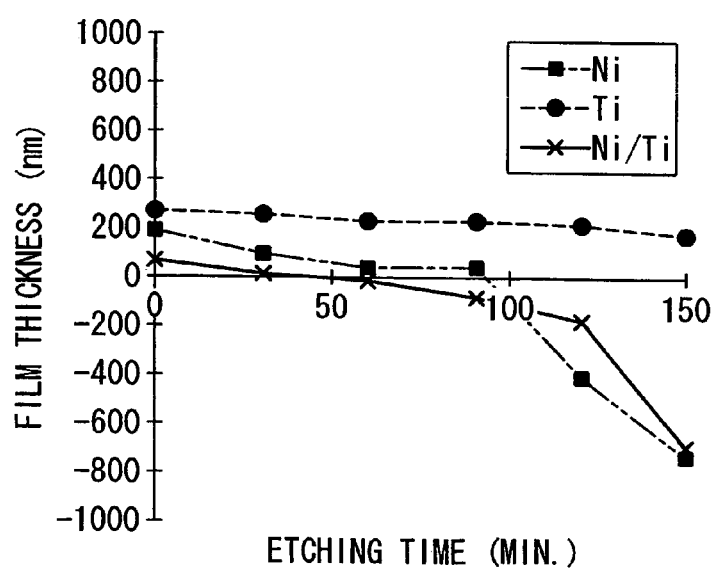
FIG. 12 is a graph showing the results of measuring changes in the film thickness of the grid and the diffusion-preventing film during etching of an example of the electrically conductive glass of the present invention in which a diffusion-preventing film is formed from chromium.

An etching treatment was performed on an electrically conductive glass provided with a diffusion-preventing film composed of titanium followed by measuring a change in film thickness in the grid composed of nickel and that in the diffusion-preventing film composed of titanium at that time, and those results are shown in FIG. 12.

Based on the results shown in FIG. 12, although the film thickness of the grid composed of nickel decreased with the passage of etching time, the diffusion-preventing film composed of titanium was hardly etched at all, and was confirmed to remain stable.

As has been explained above, since the electrically conductive glass is provided with a transparent electrically conductive film on a glass surface, and is provided with a grid including a film of a passivated metal on the transparent electrically conductive film, the electrical conductivity of the electrically conductive glass is extremely high, and the thickness of the transparent electrically conductive film can be made to be thin, thereby nearly completely eliminating any blocking of light by the grid to obtain high optical transmittance.

In addition, since the grid includes a passivated metal, an insulating, fine oxide film is formed on the surface of the grid enabling the oxide film to function as a barrier, thus, when this glass is incorporated in a dye-sensitized solar cell, a leakage current flowing from the grid towards an electrolyte is inhibited. Thereby, the dye-sensitized solar cell exhibits a high photoelectric conversion efficiency.

In addition, since a transparent electrically conductive film is provided on a glass surface, a diffusion-preventing film is provided on this transparent electrically conductive film, and a grid including a metal film containing nickel is provided on this diffusion-preventing film, the nickel contained in the metal that forms the grid can be prevented from penetrating and diffusing into the FTO and so forth that forms the transparent electrically conductive film, thereby preventing the generation of a leakage current that flows from the transparent electrically conductive film to an electrolyte.

Thus, in the case of using this electrically conductive glass in a dye-sensitized solar cell or other photoelectric conversion element, a high level of photoelectric conversion efficiency is obtained. In addition, as a result of providing the diffusion-preventing film, deterioration of the transparent electrically conductive film caused by over-etching can be prevented in the case of forming the grid by etching a metallic thin film formed on the diffusion-preventing film.

INDUSTRIAL APPLICABILITY

An electrically conductive glass of the present invention can be used for a working electrode of a dye-sensitized solar cell or other photoelectric conversion element, and allows the production of a dye-sensitized solar cell having a high photoelectric conversion efficiency.

It will be recognized that the compositions and procedures provided in the description can be effectively modified by those skilled in the art without departing from the spirit of the invention embodied in the claims that follow.

The invention claimed is:

1. An electrically conductive glass comprising, in this order:
   a glass surface;
   a transparent electrically conductive oxide film in contact with the glass surface;
   a grid comprising a passivated metal film in direct contact with the transparent electrically conductive oxide film;
   and an oxide semiconductor porous film directly physically contacting the transparent electrically conductive film, wherein:
   the passivated metal film comprises a grid metal selected from the group of metals consisting of Cr, Co, Ti, Mn, Mo, W, Zn, Sn, Ni—Cr alloy, Fe—Ni—Cr alloy Al—W alloy, Ni—Zn alloy, and Ag—Zn alloy;
   an outer layer of the grid comprises a passivated oxide film of the grid metal;
   the passivated oxide film has a thickness of about 10 to 500 nm and is provided only on the outer layer of the grid; and
   the oxide semiconductor porous film is in direct physical contact with the transparent electrically conductive oxide film at a portion of the transparent electrically conductive oxide film that is not in contact with the grid.

2. A photoelectric conversion element
   wherein the electrically conductive glass according to claim 1 is used.

3. The photoelectric conversion element according to claim 2,
   which is a dye-sensitized solar cell.

4. An electrically conductive glass according to claim 1,
   wherein the passivated oxide film is formed by performing heat treatment of the grid in an oxygen atmosphere.

* * * * *